United States Patent
Chen

(10) Patent No.: US 7,821,332 B2
(45) Date of Patent: Oct. 26, 2010

(54) SIGNAL DELAYING SYSTEM UTILIZING VOLTAGE PROVIDING CIRCUIT

(75) Inventor: Chih-Jen Chen, Kaohsiung County (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 0 days.

(21) Appl. No.: 12/779,937

(22) Filed: May 13, 2010

(65) Prior Publication Data

US 2010/0219868 A1 Sep. 2, 2010

Related U.S. Application Data

(62) Division of application No. 12/357,376, filed on Jan. 21, 2009, now Pat. No. 7,746,165.

(30) Foreign Application Priority Data

Jan. 5, 2009 (TW) ............................. 98100095 A

(51) Int. Cl.
*G05F 1/10* (2006.01)
*G05F 3/02* (2006.01)
(52) U.S. Cl. ..................... 327/544; 327/538; 327/539
(58) Field of Classification Search .............. 327/158, 327/538, 540, 544
See application file for complete search history.

(56) References Cited

U.S. PATENT DOCUMENTS

| 5,815,028 | A  | * | 9/1998  | Reynolds .................. 327/543 |
| 5,973,528 | A  | * | 10/1999 | Halamik et al. ............. 327/198 |
| 6,366,155 | B1 | * | 4/2002  | Moon et al. ................. 327/530 |
| 6,906,576 | B2 | * | 6/2005  | Sivero et al. ................ 327/536 |
| 7,436,205 | B2 | * | 10/2008 | Tada .......................... 326/33 |
| 7,436,246 | B2 | * | 10/2008 | Park .......................... 327/540 |
| 7,551,020 | B2 | * | 6/2009  | Bhattacharya et al. ...... 327/538 |
| 7,583,034 | B2 | * | 9/2009  | Lara-Ascorra et al. ...... 315/291 |
| 2004/0257151 | A1 | * | 12/2004 | Chan et al. .................. 327/540 |
| 2008/0143431 | A1 | * | 6/2008  | Bhattacharya ............. 327/544 |
| 2008/0252343 | A1 | * | 10/2008 | Yamane ..................... 327/158 |
| 2009/0212853 | A1 | * | 8/2009  | Kim et al. ................... 327/539 |
| 2009/0237152 | A1 | * | 9/2009  | Do ............................ 327/540 |
| 2010/0026380 | A1 | * | 2/2010  | Chen et al. .................. 327/544 |

* cited by examiner

*Primary Examiner*—Lincoln Donovan
*Assistant Examiner*—Adam D Houston
(74) *Attorney, Agent, or Firm*—Winston Hsu; Scott Margo; Min-Lee Teng

(57) ABSTRACT

A signal delaying system is provided, including a delay locked loop circuit and a voltage providing circuit. The delay locked loop circuit delays an input signal to generate a delayed signal. The voltage providing circuit provides a control voltage to the delay locked loop circuit for determining a delay time of the delay locked loop circuit when the delay locked loop circuit operates in a first mode; and providing a stand-by voltage to the delay locked loop circuit when the delay locked loop circuit operates in a second mode, wherein the voltage providing circuit further adjusts the stand-by voltage to make the stand-by voltage substantially equal to the control voltage.

6 Claims, 3 Drawing Sheets

SIGNAL DELAYING SYSTEM UTILIZING VOLTAGE PROVIDING CIRCUIT

CROSS REFERENCE TO RELATED APPLICATIONS

This divisional application claims the benefit of co-pending U.S. patent application Ser. No. 12/357,376, filed on Jan. 21, 2009 and incorporated herein by reference.

BACKGROUND OF THE INVENTION

1. Field of the Invention

The present invention relates to a signal delaying system, and more particularly, to a signal delaying system utilizing a voltage providing circuit.

2. Description of the Prior Art

In a typical memory control system, a delayed lock loop (DLL) circuit is generally utilized to provide a required clock signal. The memory can be operated in a normal mode, a self refresh mode, or a power down mode. The normal mode is that the memory is normally accessed and the DLL operates normally for delaying an input signal (usually a clock signal) to generate a delayed signal. The self refresh mode is that the memory executes self refreshing without any help from an external circuit. The power down mode is that the memory is in a stand-by mode without performing any data access.

In the normal mode of the memory, the DLL circuit is provided with a DLL voltage ($V_{DLL}$, it can also be viewed as a control voltage) to control delay time of the DLL circuit. In the self refresh mode or the power down mode of the memory, a stand-by voltage is provided to the DLL circuit while the DLL voltage provided to the DLL circuit is stopped. However, there exist some problems in this conventional mechanism. FIG. 1 illustrates a conventional relationship between the control voltage and standby voltage provided to a DLL circuit according to the prior art. As shown in FIG. 1, the control voltage is usually higher than the stand-by voltage. Therefore, after providing a stand-by voltage to the DLL circuit while stopping providing the DLL voltage to the DLL circuit, a specific time td is required to raise the voltage if the DLL circuit intends to go back in the normal mode, which leads to a delay in time as well as a drawback in the overall circuit system.

SUMMARY OF THE INVENTION

Therefore, one objective of the present invention is to provide an adjusting mechanism to solve the aforementioned time delay problem resulted from the control voltage and stand-by voltage in the prior art.

According to one embodiment of the present invention, a signal delaying system is disclosed. The signal delaying system comprises: a delay locked loop (DLL) circuit, for delaying an input signal to generate a delay signal; and a voltage providing circuit, for providing a control voltage to the DLL circuit to determine a delay time of the DLL circuit when the DLL circuit operates in a first mode; and for providing a stand-by voltage to the DLL circuit, wherein the voltage providing circuit further adjust the stand-by voltage to make the stand-by voltage substantially equal to the control voltage.

According to the aforementioned embodiment, the time delay problem resulted from the difference between the control voltage and the stand-by voltage in the prior art design can be compensated and solved.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Besides, the term "couple" is used here to refer any kind of direct or indirect electrical connection. Therefore, if a first apparatus is coupled to a second apparatus in the description, it means that the first apparatus is directly electrically connected to the second apparatus or indirectly connected to the second apparatus through other apparatus or method.

Figure 1:
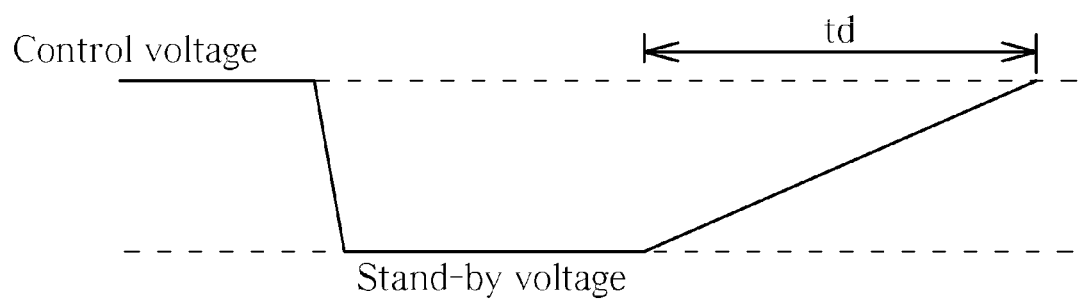
FIG. 1 is a diagram illustrating a relationship between a control voltage and a stand-by voltage provided to a DLL circuit according to the prior art.
Figure 2:
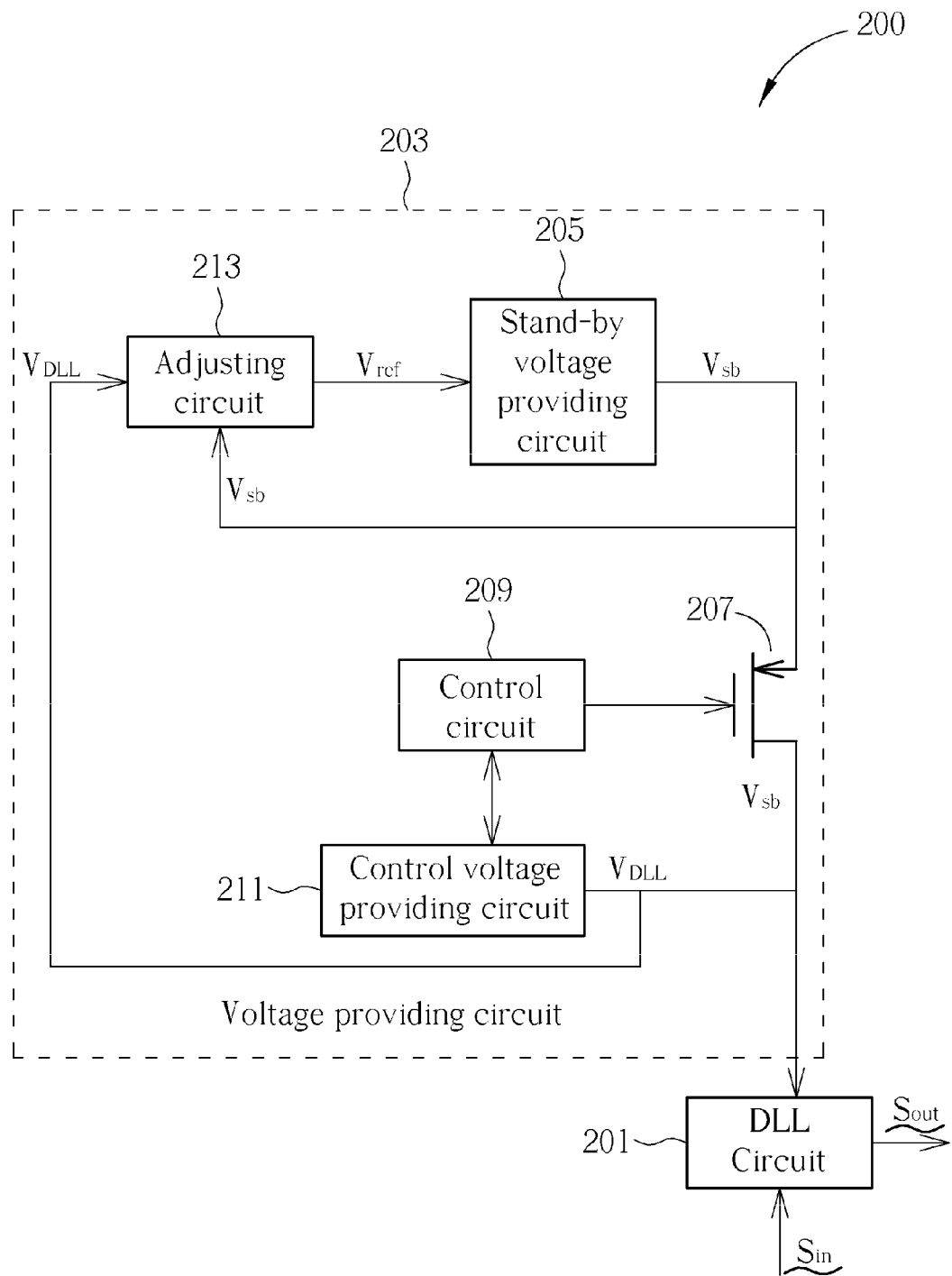
FIG. 2 is a diagram illustrating a signal delay system according to the present invention.

FIG. 2 illustrates a signal delaying system 200 according to an embodiment of the present invention. As shown in FIG. 2, the signal delaying system 200 comprises a DLL circuit 201 and a voltage providing circuit 203. The DLL circuit 201 delays an input signal $S_{in}$ to generate a delayed signal $S_{out}$. The voltage providing circuit 203 provides a control voltage $V_{DLL}$ to the DLL circuit 201 for determining a delay time of the DLL circuit 201 when the DLL circuit 201 operates in a first mode, and provides a stand-by voltage $V_{sb}$ to the DLL circuit 201 when the DLL circuit 201 operates in a second mode. The voltage providing circuit 203 further adjusts the stand-by voltage $V_{sb}$ to make the stand-by voltage $V_{sb}$ equal to the control voltage $V_{DLL}$. In this way, the aforementioned problem in the prior art can be avoided. When the circuit architecture shown in FIG. 2 is utilized in a memory (e.g., a Dynamic Random Access Memory, DRAM), i.e., the delayed signal $S_{out}$ is provided to a memory, the first mode represents that the memory operates in a normal mode, and the second mode represents that the memory operates in a self refresh mode or a power down mode.

In one exemplary embodiment, the voltage providing circuit 203 comprises a stand-by voltage providing circuit 205, a switch element 207 (e.g., a PMOS transistor in this embodiment), a control circuit 209, a control voltage providing circuit 211, and an adjusting circuit 213. The stand-by voltage providing circuit 205 is configured for generating the stand-by voltage $V_{sb}$. The switch element 207 is configured for receiving the stand-by voltage $V_{sb}$. The control circuit 209 is configured for controlling the switch element 207 and the control voltage providing circuit 211. The control voltage 211 is configured for providing the control voltage $V_{DLL}$.

The control circuit 209 controls the control voltage providing circuit 211 to provide the control voltage $V_{DLL}$ and makes the switch element 207 not conduct when the DLL circuit 201 is in the first mode. When the DLL circuit 201 enters the second mode, the control circuit 209 stops the control voltage providing circuit 211 from providing the control voltage $V_{DLL}$ to the DLL circuit 201, and makes the switch element 207 conduct to provide the stand-by voltage $V_{sb}$ to the DLL circuit 201. The adjusting circuit 213 provides a reference voltage $V_{ref}$ to the stand-by voltage providing circuit 205 according to the stand-by voltage $V_{sb}$ and the control voltage $V_{DLL}$, thereby making the stand-by voltage providing circuit 205 alter the stand-by voltage $V_{sb}$. As a result, the stand-by voltage $V_{sb}$ is substantially equal to the control voltage $V_{DLL}$. It should be noted that the voltage providing circuit 203 is not limited to providing a voltage to the DLL circuit 201; in other words, the voltage providing circuit 203 can be configured for providing a voltage to other electronic apparatus as well. In this case, the operation of the voltage providing circuit 203 can be as follows: providing a first voltage for a target apparatus when the target apparatus is in a first mode; providing a second voltage for the target apparatus and adjusting the first and the second voltage to make them substantially equal to each other when the target apparatus is in a second mode.

Figure 3:
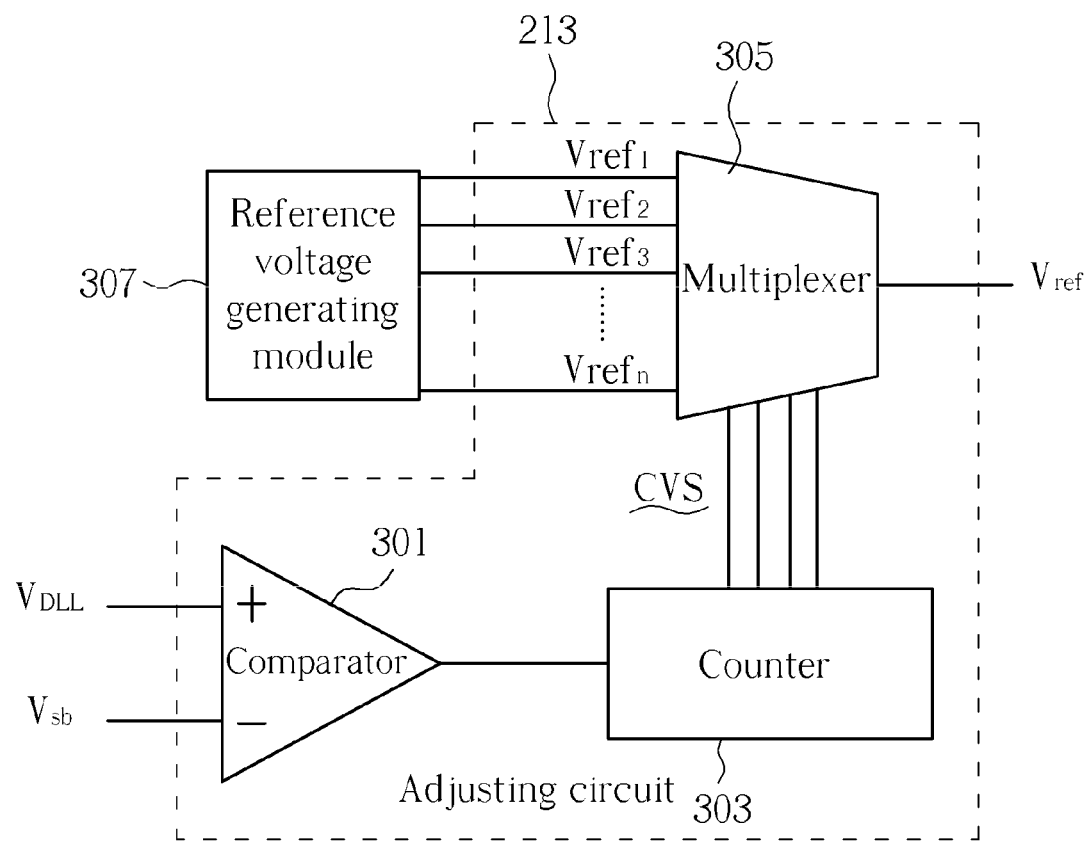
FIG. 3 is a diagram illustrating a preferred embodiment of an adjusting circuit shown in FIG. 2.

FIG. 3 illustrates a preferred embodiment of the adjusting circuit 213 shown in FIG. 2. It should be noted that the circuit architecture shown in FIG. 3 is for illustrative purposes only, and it is not meant to be a limitation to the scope of this invention. As shown in FIG. 3, the adjusting circuit 213 comprises a comparator 301, a counter 303, and a multiplexer 305. The comparator 301 compares the stand-by voltage $V_{sb}$ with the control voltage $V_{DLL}$ to generate a comparison result. The counter 303 generates a counting signal CVS according to the comparison result. The multiplexer 305 receives a plurality of candidate voltages $V_{ref1}$-$V_{refn}$, and selects one of the candidate voltages $V_{ref1}$-$V_{refn}$ as the reference voltage $V_{ref}$ according to the counting signal CVS. In one exemplary embodiment, when the control voltage $V_{DLL}$ is higher than the stand-by voltage $V_{sb}$, the counter 303 counts once, for example, to make a 4-bit signal "1000" become "1001". Therefore, the selected reference voltage $V_{ref}$ will be different. In another exemplary embodiment, when the control voltage $V_{DLL}$ is higher than the stand-by voltage $V_{sb}$, a higher reference voltage $V_{ref}$ is selected; otherwise, a lower reference voltage $V_{ref}$ is selected. The selection principle is not meant to be a limitation to the present invention. It should be noted that the circuit shown in FIG. 3 can be utilized in an architecture other than the one shown in FIG. 2. In this case, the comparator 301 compares a first voltage with a second voltage to generate a comparison result, the counter 303 generates a counting signal CVS according to the comparison result, and the multiplexer 305 receives a plurality of candidate voltages $V_{ref1}$-$V_{refn}$ and selects one of the candidate voltages $V_{ref1}$-$V_{refn}$ as the reference voltage $V_{ref}$ according to the counting signal CVS. In addition, the adjusting circuit 213 shown in FIG. 3 can also be viewed as a voltage selecting circuit.

According to the aforementioned exemplary embodiments, the time delay problem resulted from the difference between the control voltage and the stand-by voltage in the prior art design can be compensated and solved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A signal delaying system, comprising:
  a delay locked loop circuit, for delaying an input signal to generate a delayed signal; and
  a voltage providing circuit, for providing a control voltage to the delay locked loop circuit for determining a delay time of the delay locked loop circuit when the delay locked loop circuit operates in a first mode; and providing a stand-by voltage to the delay locked loop circuit when the delay locked loop circuit operates in a second mode, wherein the voltage providing circuit further adjusts the stand-by voltage to make the stand-by voltage substantially equal to the control voltage.

2. The signal delaying system of claim 1, being utilized in a memory, wherein the first mode corresponds to a normal mode in which the memory operates, and the second mode corresponds to a power down mode or a self refresh mode in which the memory operates.

3. The signal delaying system of claim 1, wherein the voltage providing circuit comprises:
  a stand-by voltage providing circuit, for generating the stand-by voltage;
  a switch element, for receiving the stand-by voltage;
  a control circuit, for controlling the switch element;
  a control voltage providing circuit, for providing the control voltage to the delay locked loop circuit, wherein when the delay locked loop circuit enters the second mode, the control circuit controls the control voltage not to provide the control voltage to the delay locked loop circuit, and turns on the switch element to provide the stand-by voltage to the delay locked loop circuit; and
  an adjusting circuit, coupled to the stand-by voltage providing circuit and the control voltage providing circuit, for providing a reference voltage to the stand-by voltage providing circuit according to the stand-by voltage and the control voltage for altering the stand-by voltage, thereby making the stand-by voltage substantially equal to the control voltage.

4. The signal delaying system of claim 3, wherein the adjusting circuit provides a higher reference voltage when the stand-by voltage is higher than the control voltage.

5. The signal delaying system of claim 4, wherein the adjusting circuit provides a lower reference voltage when the stand-by voltage is lower than the control voltage.

6. The signal delaying system of claim 3, wherein the adjusting circuit comprises:
  a comparator, for comparing the stand-by voltage and the control voltage to generate a comparison result;
  a counter, coupled to the comparator, for generating a counting signal according to the comparison result; and
  a multiplexer, coupled to the counter, for receiving a plurality of candidate voltages and selecting one of the candidate voltages as the reference voltage according to the counting signal.

* * * * *